United States Patent [19]

Payne

[11] 4,356,107

[45] Oct. 26, 1982

[54] PROCESS FOR PREPARING SILICA SOLS

[75] Inventor: Charles C. Payne, Chicago, Ill.

[73] Assignee: Nalco Chemical Company, Oak Brook, Ill.

[21] Appl. No.: 170,030

[22] Filed: Jul. 18, 1980

Related U.S. Application Data

[62] Division of Ser. No. 97,510, Nov. 26, 1979, abandoned.

[51] Int. Cl.$^3$ ............... B01J 13/00; C01B 33/14
[52] U.S. Cl. ............................ 252/313 S; 51/308
[58] Field of Search ..................... 252/313 S; 51/308

[56] References Cited

U.S. PATENT DOCUMENTS

| | | | |
|---|---|---|---|
| 2,680,721 | 6/1954 | Broge et al. | 252/313 S |
| 2,956,958 | 10/1960 | Iler | 252/313 S |
| 3,538,015 | 11/1970 | Mindick et al. | 252/313 S |
| 3,901,987 | 8/1975 | Payne et al. | 252/313 S X |

*Primary Examiner*—Richard D. Lovering
*Attorney, Agent, or Firm*—Richard L. Johnston

[57] ABSTRACT

New and useful silica sols especially suitable for polishing semiconductor wafers are prepared by a special process involving heating a broad distribution aqueous silica sol containing larger silica particles of which at least 50% in number have a particle size of at least 40 millimicrons, the remainder of the silica particles being smaller and of different sizes, whereby the resultant silica sol contains a number of the larger silica particles having a particle size of at least 40 millimicrons which is at least as great as the starting sol, the weight average of said larger silica particles is greater than that of the larger silica particles in the starting sol, the number of smaller particles is less than the number of smaller particles in the starting sol, and the resultant sol contains fewer particles of different sizes than the starting sol.

9 Claims, No Drawings

PROCESS FOR PREPARING SILICA SOLS

RELATED APPLICATION

This application is a division of U.S. application Ser. No. 97,510 filed Nov. 26, 1979, and now abandoned.

BACKGROUND

The use of silica sols in polishing semi-conductor wafers made of silicon, sapphire or gadolinium-gallium-garnets (GGG wafers) is known in the art. Conventional silica sols which have been used for this purpose leave much to be desired from the standpoint of uniformity of results and particularly there is a need for silica sol products which will provide an improved polishing rate over conventional silica sols.

It should be noted that the present invention is concerned with mechanical polishing as the sole polishing means as distinguished from chemical-mechanical polishing such as that described in U.S. Pat. No. 3,930,870. It should also be noted that high silica concentrations are necessary for this type of polishing and that silica powders added to water cannot be used satisfactorily because silica concentrations of such powders in water greater than 10% by weight result in gels.

It is well known that there is a large body of literature dealing with the preparation of silica sols wherein the silica particles have various diameters and the sols are prepared by many different methods. A list of patents and literature is given on pages 91–100 of Surface and Colloid Science published in 1973 by John Wiley & Sons. Among other things, this publication discloses on pages 12–15 methods of increasing the particle size of the silica particles in silica sols by heating. In one such process disclosed by Rule in U.S. Pat. No. 3,012,972, a sol consisting of particles from 8–15 millimicrons (m$\mu$) in diameter is first thoroughly deionized, and then autoclaved at from 300°–350° C. under autogenous pressures. This is said to produce silica particles in the diameter range from 88 to 150 m$\mu$ which can be concentrated to a stable sol containing over 60% by weight of silica. However, while large silica particles can be formed in this manner and in other ways as described in the aforesaid literature and the patents referred to therein, such products do not necessarily provide the most suitable silica sols for mechanical polishing.

It is, therefore, desirable and it is one of the objects of the present invention, to provide new and improved silica sol products which, when employed in mechanical polishing and particularly in polishing semi-conductor wafers of the type previously described, will increase the polishing rate and thereby reduce the time required for such polishing.

BRIEF SUMMARY OF THE INVENTION

In accordance with the invention an improved polishing product and improved results in mechanically polishing semi-conductor wafers such as silicon, sapphire, and gadolinium-gallium-garnets (GGG wafers) is provided by the preparation and use of a special type of high surface density particle silica sol prepared by a special process wherein a large particle sized silica sol with a narrow distribution of particle sizes is prepared by heating broad distribution silica sols at temperatures of 280° F. (138° C.) to 465° F. (240° C.) under superatmospheric pressure for a predetermined period of time while maintaining an alkaline pH sufficient to permit growth of particle size without completely dissolving the silica particles. This process not only results in the preparation of large particle sized silica sols with a narrow distribution of particle sizes but also in the preparation of silica sols of this type in which the hardness or density of the surfaces of the particles is increased.

Silica sols of the type described, when used in conventional processes for mechanically polishing semi-conductor wafers such as GGG wafers, have shown at least 35% improvement in polishing rate over standard silica sols heretofore employed for this purpose.

DETAILED DESCRIPTION OF THE INVENTION

In its preferred embodiments the invention provides a process of preparing large particle sized silica sols with narrow particle distribution and enhanced surface density as compared to the surface density of silica sol particles in a silica sol starting material. The process comprises heating a broad distribution aqueous silica sol containing larger silica particles of preferably at least 50% in number and preferably at least 95% in weight average have a particle size of at least 40 millimicrons, the remainder of the silica particles in the starting material being smaller and of different sizes. One type of starting material can be one which is essentially bimodal in distribution in which the larger particles range from 60 millimicrons to 80 millimicrons in size with a number average of approximately 50% and a weight average of approximately 95% and the small particles range from 10 millimicrons to 20 millimicrons with a number average of approximately 50% and a weight average of approximately 5%.

The aqueous silica sol starting material is preferably heated in a temperature range of 280° F. (138° C.) to 465° F. (240° C.) under superatmospheric pressure, preferably in a closed vessel under the autogenous pressure developed. At a temperature of 280° F. the pressure developed is about 50 pounds per square inch (psi), at 345° F. the pressure developed is about 125 psi and at 465° F. the pressure developed is about 475 psi.

The normal pH of the starting aqueous silica sol of the bimodal type previously described is about 8 or slightly higher. Higher alkalinity can be obtained by adding caustic soda (NaOH). For the purpose of the invention good results have been obtained by using a pH within the range of 8 to 10.5 with the proviso, however, that the pH under the conditions used cannot be so high that the silica particles are completely dissolved at the temperature conditions used. Thus, at a starting pH of 10.5 good results can be obtained by heating a bimodal silica sol of the type previously described under the autogenous pressure at a temperature of 280° F. for 5 hours. Satisfactory results can also be obtained with the same type of starting material by heating under the autogenous pressure to 345° F. (174° C.) for 5 hours at a pH of 10.5. Under these conditions the higher pH dissolves the small particles faster per unit of time. If the temperature is raised to 465° F. and a starting material of the type previously described is heated at this temperature at a pH of 10.5, the high temperature and pH completely dissolve the silica within 15 minutes causing it to plate out on the walls of the reactor. However, when a starting material of the type described is heated under autogenous pressure for 5 hours at a starting pH of 8.2, the silica is not completely dissolved and the final product shows only large particles ranging from 65 millimicrons to 130 millimicrons, the number average being 100% and the weight average being 100%. Examination of the product after one hour of heating under these conditions showed the same results and further heating caused very little change in the product. This product can be characterized as a mono-dispersed sol.

Accordingly, while the temperature used will ordinarily be within the range of 280°–465° F. (138° C.–240° C.), the time of heating and the pH must be adjusted so as to increase the number and size of the larger size particles and to increase the surface density of the resultant larger size particles while reducing the number of smaller size particles, thereby producing an aqueous silica sol in which the number of larger silica particles having a particle size of at least 40 millimicrons is at least as great as in the starting sol, the weight average of said larger silica particles is greater than that of the larger silica particles in the starting sol, the number of smaller particles is less than the number of smaller particles in the starting sol, and the resultant sol contains fewer particles of different sizes than the starting sol. A particularly preferred product is one in which the particles are mono-dispersed, i.e., are all approximately of the same size.

The invention will be further illustrated but is not limited by the following examples in which the quantities are by weight unless otherwise indicated.

EXAMPLE I

The preparation of a silica sol was carried out in a 2 liter turbine agitated 316 stainless steel autoclave. The equipment was electrically heated and the temperature was automatically controlled. The vessel was equipped with a ⅛" sampling line and the product was removed through it into a heat exchange system for sampling. A cooling coil was also provided for rapid cooldown tests. Silica sol (1500 grams) was placed in the vessel and after closing was heated for the test period. Sampling began at 5 minutes at the temperature used and continued throughout the run as long as the sampling line did not plug.

Variables considered to be important were percent solids pH, temperature, time, and batch cooling rate.

Solids were kept at 40% by weight because this was the concentration of the potential starting material as currently manufactured. Preliminary work had been done at 10% to demonstrate feasibility but this level was deemed to be uneconomical.

The pH of a silica sol system has a definite effect on the solubility of the silica. The normal pH is about 8 or slightly higher. The normal pH was selected for the low end to be tested and 10.5 as the upper end. The higher alkalinity was obtained by adding caustic soda.

When silica sols are treated with caustic soda some low levels of coagulation occur. Therefore, after mixing for a few minutes with a magnetic stirrer after caustic addition, the material was passed through a glass wool pad in order to separate any aggregated particles.

Two temperatures were initially selected—280° F. (138° C.) and 345° F. (174° C.). A third temperature was later selected, namely, 465° F. (240° C.). At 280° F. the pressure developed is about 50 psi, at 345° F. about 125 psi, and at 465° F. about 475 psi.

The starting silica sol was essentially bimodal in distribution, the larger particles ranging from 60 millimicrons to 80 millimicrons (number average=50%; weight average=95%); the small particles ranging from 10 millimicrons to 20 millimicrons (number average=50%; weight average=5%).

This starting material was heated in a vessel of the type described under the autogenous pressure at 280° F. (138° C.) for 5 hours at a starting pH of 8.2.

The final product contained larger particles ranging from 60 millimicrons to 110 millimicrons (number average—68%; weight average=97%); some intermediate particles of 30 millimicrons and the remainder small particles in the 10 millimicron to 20 millimicron range (total of medium and small number average=40%; weight average=3%). Some fused particles were also present.

EXAMPLE II

The procedure was the same as in Example I except that the temperature used was 345° F. (174° C.). The large silica particles in the product ranged in size from 65 millimicrons to 85 millimicrons (number average=50%, weight average=98%). All particles in the 10 millimicron to 20 millimicron range had disappeared and had been replaced by particles in the 25 millimicron to 35 millimicron particle range (number average=50%; weight average—2%). Some fused particles were also present.

EXAMPLE III

The procedure of Example II was carried out except that the time of heating was 24 hours. This resulted in a considerable reduction in the number of small particles present.

EXAMPLE IV

The procedure was carried out as described in Example I except that the time of heating under autogenous pressure was 465° F. (240° C.). The final product showed only large particles ranging from 65 millimicrons to 130 millimicrons (number average=100%; weight average=100%).

EXAMPLE V

The procedure was carried out as in Examle IV except that the product was heated for an additional hour at 465° F. with practically the same results and with the further heating causing very little change in the products.

EXAMPLE VI

The process was carried out as described in Example I except that the starting pH was 10.5. It was noted that the larger particles had a smoother surface and a more dense appearance. However, the number and weight averages of the particles in the resultant product were otherwise essentially the same as those in the product obtained by the process of Example I.

EXAMPLE VII

The process was carried out as described in Example I except that the starting material was heated under autogenous pressure to 345° F. for 5 hours at a pH of 10.5. In the resultant product essentially all of the small particles had disappeared indicating that under the same conditions the higher pH dissolves the small particles faster per unit of time.

EXAMPLE VIII

The process was carried out as described in Example I except that the temperature used as 465° F. and the pH 10.5. Within 15 minutes the silica had completely plated out on the walls of the reactor. Apparently the high temperature and pH completely dissolved the silica, thereby indicating that the process would not operate satisfactorily at the higher pH when a temperature of 465° F. is used.

EXAMPLE IX

From the preparation described in the preceding examples it was concluded that optimum results could probably be obtained by heating the starting bimodal silica sol as described in Example I at a temperature of 345° F. for 5 hours and using a fast cooldown rate to generate more aggregated particles. The starting silica sol had the following characteristics: specific gravity 1.306; pH 8.2.; condutance 2600μ; viscosity 9.6 cps; centrifugal sedimentation 0.1%.

11 gallons of this product were prepared using the general procedure described in Example I with a fast cooldown rate of the final product which was generally similar in its characteristics to the product resulting from Example II.

This product was tested in comparison with the starting material as a control in the mechanical polishing of GGG wafers. 10 mils of stock are normally removed from the wafer and this operation normally takes 10 hours. The starting material silica sol without the high temperature treatment took the usual 10 hours to complete the polishing. The high temperature product required 6.5 hours to complete the polishing or a 35% improvement in polishing rate for 10 mil stock removal. It appears, therefore, that the improvement in polishing rate must be due to the fact that the silica particles in the silica sol as prepared herein are densified and have a harder surface.

In the practice of the invention it was noted that the surface of the silica particles become smoother apparently due to densification. The densification can be followed by examining the particles heated at high temperatures and pressures and comparing physical size with values obtained by the particle diameter titration method.

The physical size of the particles showed to change with heating but the value of the particle size by titration continually increased.

The continual increase of particle size by the titration method can be explained by the chemical reaction

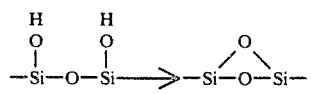

The hydrogens on the silanol groups are titratable. The particle diameter formula shows an inverse relation of titratable hydrogen ions to particle diameter, i.e., Particle Diameter = K/V where:
K is constant
V is the amount of caustic used to titrate the hydrogen ions on the silanol surface.

As the volume of titrant (NaOH) goes down the apparent particle size increases.

The volume of titrant can only decrease when there are fewer titratable silanol groups, i.e., there is condensation of the silanol (SiOH) groups to Siloxane (SiOSi) groups on the surface and within the pores of the particle even though the particles are in an aqueous medium. It is this siloxane formation on the surface of the particle that appears to be responsible for an improved polishing rate on GGG wafers.

As a result of the tests carried out in the practice of the invention it was concluded that large particle sized silica sols with narrow particle distribution can be obtained by heating broad distribution silica sols at temperatures of 345° F. to 465° F. for one to five hours.

It was further concluded that the particle size and distribution are dependent upon silica concentration, temperature, pH, and cooling rate. Thus, lower concentrations of silica require less time and lower temperatures to produce monodispersed sols. Higher temperatures increase the dissolution rate of small particles and increase the deposition rate on to large particles. Higher pH starting materials (e.g., pH of 10.5) require less time at a given temperature than low pH products (pH 8.2) to produce monodispersed sols. However, too high a pH at high temperatures must be avoided otherwise the silica will dissolve completely. Fast cooling rates from high temperature preparations increase the number of aggregates in the product.

I claim:

1. A process of preparing larger particle sized silica sols with narrow particle distribution and enhanced surface density as compared to the surface density of silica sol particles in a silica sol starting material which consists essentially in heating a broad distribution aqueous silica sol containing larger silica particles of which at least 50% in number have a particle size of at least 40 millimicrons, the remainder of the silica particles being smaller and of different sizes, under superatmospheric pressure, at a temperature of 138° C. to 240° C. and a starting alkaline pH within the range of 8–10.5 sufficient to permit growth of particle size without completely dissolving the silica particles for a period of time sufficient to increase the number and size of the larger sized particles and to increase the surface density of the resultant larger sized particles while reducing the number of smaller sized particles, the temperature, pH and time of heating being sufficient to produce an aqueous silica sol in which the number of larger silica particles having a particle size of at least 40 millimicrons is at least as great as in the starting sol, the weight average of said larger silica particles is greater than that of the larger silica particles in the starting sol, the number of smaller particles is less than the number of smaller particles in the starting sol, and the resultant sol contains fewer particles of different sizes than the starting sol.

2. A process as claimed in claim 1 in which the silica sol starting material is essentially bimodal in distribution, with approximately 50% number average and 95% weight average of large silica particles ranging in size from 60 millimicrons to 80 millimicrons and approximately 50% number average and 5% weight average of such silica particles ranging in size from 10 millimicrons to 20 millimicrons.

3. A process as claimed in claim 2 in which heating is effected under autogenous pressures, the temperature of heating is approximately 138° C. to 240° C., the pH of the starting material is approximately 8.2 and the time of heating is sufficient to form a sol in which the silica particles are only large particles ranging in size from 65 to 130 millimicrons.

4. A process as claimed in claim 1 in which the silica sol starting material is heated for one to five hours under autogenous pressures at a pH of approximately 8.2.

5. A process as claimed in claim 1 in which heating is effected under autogenous pressures, the temperature of heating is approximately 138° C., the time of heating is 1 to 5 hours, and the pH of the starting material is approximately 8.2.

6. A process as claimed in claim 1 in which heating is effected under autogenous pressures, the temperature of heating is approximately 174° C., the time of heating is 1 to 5 hours and the pH of the starting material is approximately 8.2.

7. A process as claimed in claim 1 in which heating is effected under autogenous pressures, the temperature of heating is approximately 240° C., the time of heating is 1 to 5 hours and the pH of the starting material is approximately 8.2.

8. A process as claimed in claim 1 in which heating is effected under autogenous pressures, the temperature of heating is approximately 138° C., the time of heating is 1 to 5 hours, and the pH of the starting material is approximately 10.5.

9. A process as claimed in claim 1 in which heating is effected under autogenous pressures, the temperature of heating is approximately 174° C., the time of heating is 1 to 5 hours, and the pH of the starting material is approximately 10.5.

* * * * *